United States Patent [19]

Funamoto et al.

[11] Patent Number: 4,809,058
[45] Date of Patent: Feb. 28, 1989

[54] INTEGRATED CIRCUIT DEVICE

[75] Inventors: Takao Funamoto; Ryoichi Kajiwara; Mituo Katou; Takeshi Matsuzaka; Tomohiko Shida; Hiroshi Wachi, all of Hitachi; Kazuya Takahashi, Katsuta; Masatoshi Watanabe, Hitachi; Minoru Yamada, Iruma; Keiichirou Nakanishi, Kokubunji; Katuo Sugawara, Hitachi, all of Japan

[73] Assignee: Hitachi, Ltd., Tokyo, Japan

[21] Appl. No.: 941,812

[22] Filed: Dec. 15, 1986

[30] Foreign Application Priority Data

Dec. 16, 1985 [JP] Japan .................................. 60-280960
Jun. 6, 1986 [JP] Japan .................................. 61-130120

[51] Int. Cl.⁴ ..................... H01L 23/02; H01L 39/02; H01L 25/04
[52] U.S. Cl. ......................................... 357/82; 357/74; 357/80; 357/81
[58] Field of Search ......................... 357/82, 81, 74, 80

[56] References Cited

U.S. PATENT DOCUMENTS 2,501,331  3/1950  Heir ........................ 357/82
3,512,582  7/1968  Chu et al. ................. 357/82
4,631,636 12/1986  Andrews ................... 357/82

FOREIGN PATENT DOCUMENTS 55-162249 12/1980 Japan ..................... 357/81
58-79755   5/1983 Japan ..................... 357/81
59-98541   6/1984 Japan ..................... 357/82
59-202654 11/1984 Japan ..................... 357/81

Primary Examiner—Andrew J. James
Assistant Examiner—Gregory Key
Attorney, Agent, or Firm—Antonelli, Terry & Wands

[57] ABSTRACT

An integrated circuit device comprising a wiring substrate on one surface of which integrated circuit chips are mounted, a power source substrate of a laminated structure provided in contact with the other surface of the wiring substrate and formed by alternately laminating a plurality of feeding conductor layers of a heat conductive metal and a plurality of electrically insulating layers of an electrically insulating material, and bonding together the laminated layers, a means for electrically connecting the wiring substrate and the power source substrate to each other, and a heat radiating means inserted in at least either the feeding conductor layers or the electrically insulating layers and adapted to radiate the heat, which occurs in the power source substrate, to the outside thereof. This integrated circuit device has a power source substrate of a remarkably high heat radiating efficiency, and is suitably used as an integrated circuit device having integrated circuit chips mounted with a high density on a wiring substrate therein.

15 Claims, 5 Drawing Sheets

INTEGRATED CIRCUIT DEVICE

BACKGROUND OF THE INVENTION

1. Field of the Invention

This invention relates to an integrated circuit device, and more particularly to an integrated circuit device suitably used for large-scale electronic computers.

2. Description of the Prior Art

In order to obtain an integrated circuit device used for large-scale electronic computers and having very much densely-arranged integrating circuit chips, a plurality of integrating circuit chips are mounted on a multilayer wiring substrate.

This type of integrated circuit device is generally formed by mounting integrated circuit chips, such as LSI chips on one surface of a multilayer wiring substrate, and connecting a feeding conductor, which is provided in the unitarily-formed substrate, and an external power source to each other electrically by a connecting terminal.

As the number of the integrating circuit chips is increased to heighten the mounting density thereof, the sizes of the substrate become large and the substrate temperature increases, so that the substrate readily bends and waves. The specification of Japanese Utility Model Publication No. 32312/1983 published on July 18, 1983, which is entitled "Heat Radiating and Power Supplying Structure for Ceramic Substrates", states that, since the waving or bending of a substrate increases substantially in proportion to the sizes thereof, it becomes very difficult to attach a cooling radiation fin to the substrate by using solder or a bonding agent. It further states that it is difficult in a large-sized substrate to supply an electric current through a feeding conductor therein as in a conventional substrate since the voltage in the feeding conductor drops very greatly. The specification proposes that a feeding conductor be separated from a wiring substrate on which integrated circuit chips are to be mounted. To be concrete, it proposes that insulating sheets having excellent thermal conductivity and mechanical elasticity and feeding conductor plates be laminated alternately and inserted between a wiring substrate (ceramic substrate) and a radiation fin to then fix the resultant product as a whole by bolts. This structure gives rise to problems concerning the contact thermal resistance between the insulating sheets and feeding conductor plates but no reference is made at all to this point. Also, no concrete materials for the insulating sheets having excellent thermal conductivity and mechanical elasticity are disclosed at all.

SUMMARY OF THE INVENTION

An object of the present invention is to provide an integrated circuit device capable of increasing to a high level the density of the integrated circuit chips mounted on a wiring substrate, by improving the heat radiation efficiency of these chips.

The present invention is directed to an integrated circuit device having a wiring substrate on which integrated circuit chips are mounted, and a power source substrate of a unitary structure consisting of feeding conductor layers connected to an external power source, and electrically insulating layers, which conductor layers and insulating layers are laminated alternately and bonded together, heat radiating means being provided in at least one of the feeding conductor layers and electrically insulating layers as will be understood clearly from the statement to be given later.

The present inventors ascertained that, in order to obtain an integrated circuit device in which the integrated circuit chips are mounted with a high density on a wiring substrate, and prevent an increase in the dimensions of the device, it was effective to separately form the wiring substrate on which the integrated circuit chips are to be mounted, and a power source substrate.

However, it was also ascertained that, when an integrated circuit device was formed by constructing a wiring substrate and a power source substrate separately as mentioned above, the power source substrate generated heat due to an increase in the electric power to destroy the integrated circuit chips in an extreme case. The calorific power of the power source substrate increases as the feeding power is increased, and it is possible that this calorific power exceeds 500° C. In order to prevent the integrated circuit chips from being destroyed, the temperature of the power source substrate should be controlled to be not more than 100° C., and preferably not more than 80° C.

Various types of means for removing the heat occurring in the integrated circuit chips in an integrated circuit device have already been proposed. For example, Japanese Patent Laid-open No. 32348/1985 entitled "Cooling Structure-carrying Semiconductor Device" also discloses some means used for this purpose. However, no or substantially no means for removing the heat occurring in a power substrate have heretofore been proposed. There are substantially no reports on the generation of heat in a power source substrate.

The present inventors discovered that, even when a heat radiation fin was attached to a power source substrate consisting of a laminated structure of feeding conductor layers and electrically insulating layers, the heat occurring in the power source substrate could not practically be removed. In an experiment, in which an electric current of 500 A was supplied to a power source substrate consisting of seven 150 mm square feeding conductor layers and eight 150 mm square electrically insulating layers, which were laminated alternately and combined unitarily, with a heat radiation fin attached to this power source substrate, the temperature of the heat occurring in the substrate exceeded 500° C., and did not drop greatly even when the cooling air was supplied thereto at a wind velocity of 10 m/sec.

The present inventors succeeded in reducing markedly the temperature of the heat occurring in a power source substrate, by providing heat radiating means in one or both of the feeding conductor layers and electrically insulating layers which constitute the power source substrate.

It is desirable but not strictly necessary to provide the heat radiating means in each of the feeding conductor layers or electrically insulating layers. In an experiment in which the temperature of the heat occurring in a power source substrate consisting of a multilayer lamination structure of feeding conductor layers and electrically insulating layers was practically measured, the temperature was the highest at the portion of the power source substrate which was close to a wiring substrate, and decreased gradually as the distance between a portion of the power source substrate and the wiring substrate increased. Therefore, the lower layers in the power source substrate, i.e. the layers therein which are positioned on the opposite side of the wiring substrate may not necessarily be provided with heat radiating means.

It is preferable that not less than ½ of the feeding conductor layers or electrically insulating layers in a power source substrate be provided with heat radiating means, and it is more preferable that not less than ⅔ of such layers be provided with heat radiating means. Namely, in a power source substrate having ten electrically insulating layers, at least five, preferably not less than seven and more preferably all of the ten layers should be provided with heat radiating means. It is also possible that the alternate layers be provided with the heat radiating means.

The degree of the heat radiating effect of each layer in a power source substrate may be varied. To be concrete, the heat radiating effect of the layer which is the closest to a wiring substrate is set to a maximum level, and the heat radiating effect of the other layers can be reduced in the direction in which the distance between these layers and the wiring substrate increases. For example, in the case where heat radiating filler, which will be described later, is mixed in the electrically insulating layers to furnish the same layers with the heat radiating functions, the degree of the heat radiating effect of these layers can be varied by varying the quantity of this filler in each layer.

The heat radiating means may be provided more preferably in the electrically insulating layers than in the feeding conductor layers for the reason that the feeding conductor layers, which are to be formed of a metal having a high thermal conductivity, such as copper or a copper alloy, have excellent heat radiating characteristics by themselves. With regard to the heat radiating characteristics of the layers in a power source substrate, rather the electrically insulating layers have problems. Therefore, it is recommendable that the heat radiating means be provided in the electrically insulating layers.

It is very preferable to use an organic resin as the material for the electrically insulating layers and also as a bonding agent inserted among the feeding conductor layers, and mixing a heat radiating filler in the layers of the organic resin in such a manner as will be clearly described later. If a power source substrate is formed in this manner, the filler can be utilized as a heat radiating means. Moreover, owing to the presence of this filler, the cracking resistance of the layers of the organic resin can be improved. The coefficients of thermal expansion of the layers of an organic resin and feeding conductor layers have a large difference, so that cracks are liable to occur in the former layers which have a lower coefficient of thermal expansion. However, if such a filler is mixed in these layers of an organic resin, it works so as to prevent the development of the cracks, so that the cracking resistance of the same layers can be improved. If a resin working as a binder is additionally used, it becomes unnecessary to use a bonding agent or solder for the purpose of unitarily combining the electrically insulating layers and feeding conductor layers.

The electrically insulating layers may consist of an organic material, an inorganic material or a mixture thereof. A material having a high coefficient of electrostatic induction, especially, a coefficient of electrostatic induction of not less than 4 is preferably used as a material for the electrically insulating layers because an electric current of as high as 500 A per layer usually flows through a power source substrate. In order that dielectric breakdown does not occur in the electrically insulating layer even when such an electric current flows through the power source substrate, it is preferable to set the coefficient of dielectric induction of the electrically insulating layer to a high level, especially, not less than 4.

The organic material used for the electrically insulating layers is preferably epoxy resin, addition polymerized polyimide, polyvinylidene fluoride or phenol formaldehyde. The coefficient of dielectric induction of polyvinylidene fluoride is 7-8, and that of phenol formaldehyde about 6.

The inorganic material usable for the electrically insulating layers is a ceramic material of high heat conductive silicon carbide (SiC), a ceramic material of high-purity silicon carbide, single crystal of silicon carbide, alumina ($Al_2O_3$) or beryllium oxide (BeO). However, it is difficult to form a plate of several hundred $\mu$m by using a ceramic material. Hence, an organic resin is more conveniently used.

The feeding conductor layers consist preferably of copper or a copper alloy. The copper alloy to be used is preferably a copper-silver alloy or a copper-titanium alloy.

The heat radiating filler referred to previously consists preferably of a metallic filler composed of copper, silver or an alloy thereof, or a ceramic filler composed of alumina or silicon carbide.

It is preferable to form minute bores, which are communicated with the outside air, in the feeding conductor layers or electrically insulating layers as heat radiating means in the power source substrate, i.e. as inside-layer heat radiating means. Owing to these bores provided in the mentioned layers, the heat radiating area increases, so that the heat radiating capability of the power source substrate can be improved. If a coolant, for example, a liquid, such as water or freon, or a gas, such as the air is passed through such bores to forcibly cool the layers in the power source substrate, the heat radiating capability thereof can be further improved.

An experiment was conducted by alternately laminating seven 150 mm square feeding conductor layers of pure copper and eight 150 mm square electrically insulating layers of epoxy resin, inserting alumina fillers as heat radiating means in the electrically insulating layers, and supplying an electric current of 500 A to the resultant power source substrate. In this experiment, the temperature of the heat occurring in the power source substrate was about 60° C. on the surface on the side of the wiring substrate, and about 55° C. on the opposite surface. Namely, the heat radiating capability of this power source substrate could be improved about ten times that of a power source substrate provided with a heat radiating fin alone.

In the power source substrate in the integrated circuit device according to the present invention, the feeding conductor layers and electrically insulating layers are combined unitarily by bonding, so as to minimize the contact thermal resistance thereof.

When an organic resin is used as a material for the electrically insulating layers, the resin is dissolved in a solvent, such as acetone, and the resultant solution is applied to the feeding conductor layers. As a result, electrically insulating layers can be formed and these layers can be bonded at the same time to the feeding conductor layers.

When an inorganic material is used for the electrically insulating layers, it is preferable that the layers formed of the material be bonded to the feeding conductor layers by using solder or some other bonding material.

According to the present invention, the wiring substrate on which integrated circuit chips are mounted is preferably provided with terminal pins as shown in FIG. 1, which will be described later, which pins are used to join the same substrate to the feeding conductor layers in a power source substrate.

On the other hand, the power source substrate is preferably provided with through holes into which the terminal pins are inserted.

If these parts are formed in this manner, the wiring substrate and power source substrate can be connected electrically via the terminal pins.

When a coolant is introduced into the coolant flow passages provided in the electrically insulating layers or feeding conductor layers in the power source substrate, so as to radiate the heat, it is important to provide a means for supplying a coolant from the outside of the power source substrate into the coolant flow passages therein.

It is proposed that the connecting terminals for supplying electric power from an external power source to the power source substrate be utilized as the coolant supply means. The concrete construction of this means will be described in the later statement regarding FIGS. 11–14.

If coolant flow passages are provided in the feeding connecting terminals, the feeding of an electric current and the supplying of a coolant can be done in a concentrated manner. This enables the maintenance and inspection of the coolant flow passage-carrying power source substrate of laminated construction to be carried out easily, and the integrated circuit device to be made compact.

DESCRIPTION OF THE PREFERRED EMBODIMENTS

An embodiment of the integrated circuit device according to the present invention will now be described with reference to the drawings.

Figure 1:
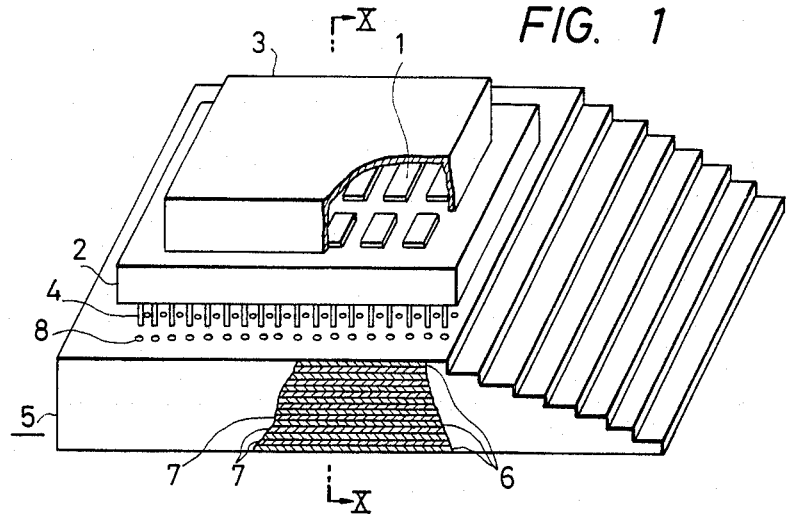
FIG. 1 is a perspective view of an embodiment of the integrated circuit device according to the present invention.

FIG. 1 is a perspective view of an embodiment of the present invention. A plurality of integrating circuit chips 1, such as LSI chips, are mounted on a wiring substrate 2, and covered with a seal cap 3. Pins 4 are provided on the surface of the wiring substrate 2 which is opposite the surface thereof on which are integrated circuit chips 1 are mounted, these pins 4 and integrated circuit chips 1 being electrically connected.

A power source substrate 5 consists of a structure formed by alternately laminating electrically insulating layers 6 and feeding conductor layers 7, and bonding them to one another unitarily. The example of the power source substrate 5 in FIG. 1 has eight electrically insulating layers 6 and seven feeding conductor layers 7. The power source substrate 5 is provided with through holes 8 into which the terminal pins 4 on the wiring substrate 2 are to be inserted.

In the integrated circuit device thus constructed, an electric current is supplied from an external power source device (not shown) to the power source substrate 5, and then from the feeding conductor layers 7 in the power source substrate 5 to the integrated circuit chips 1 through the terminal pins 4 on the wiring substrate 2.

The power substrate 5 has an internal heat radiating structure. Preferred heat radiating structures will now be described with reference to FIGS. 2–10. FIGS. 2–10 except FIG. 6 are sectional views taken along the portions of heat radiating structures which correspond to the portion shown by the line X—X in FIG. 1.

Figure 2:
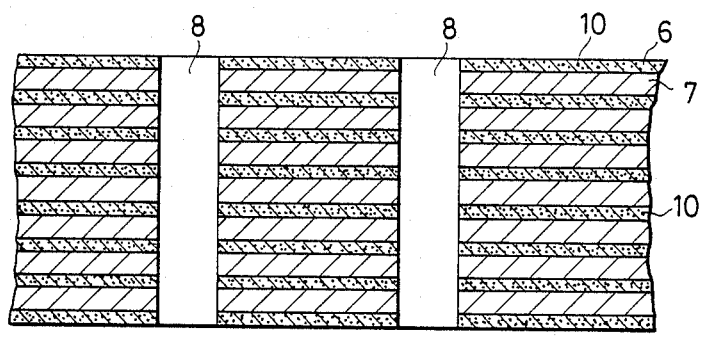
FIGS. 2 and 3 are sectioned front elevation of examples of the power source substrate in the present invention.
Figure 9:
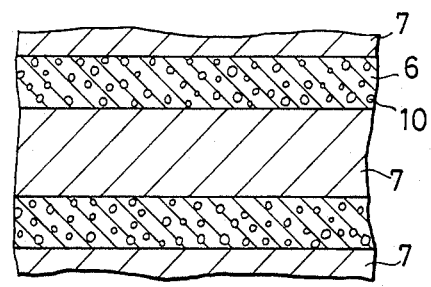
Figure 10:
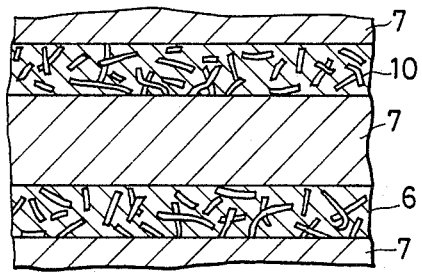

FIG. 2 shows an example of the heat radiating structure, in which a filler 10 consisting of powder or short fibers is mixed as a heat radiating means in electrically insulating layers 6. A concrete example of this type of electrically insulating layer is formed by molding a plate out of a mixture of an organic resin, such as epoxy resin and the powder of a ceramic material, such as alumina. When powder is used, the particle size shall be set not larger than the thickness of the electrically insulating layer. The diameter of a fiber shall, of course, be set not larger than the thickness of the same layer. The length of the fiber may be arbitrarily set. The thickness of the electrically insulating layer 6 may be around 100–300 $\mu$m, and the thickness of the feeding conductor layer 7 around 200–400 $\mu$m. Reference numeral 8 denotes through holes into which the terminal pins 4 shown in FIG. 1 are inserted. FIG. 9 is a sectional view of a part of a power source substrate having powdered filler 10 in the electrically insulating layers 6, and FIG. 10 shows an example of the heat radiating structure in which a filler 10 of short fibers instead of powder is mixed in the electrically insulating layers 6. Referring to FIGS. 9 and 10, the same reference numerals as in FIG. 2 designate the same parts.

Figure 3:
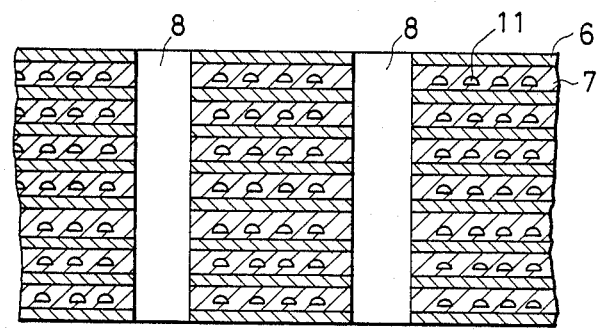

FIG. 3 shows an example of the heat radiating structure in which minute bores 11 are formed in the feeding conductor layers to furnish the same layers with the heat radiating functions. These bores 11 can be formed by utilizing the photoetching techniques. The bores 11 can sufficiently function if they have a radius of 80–120 $\mu$m. The shape of these bores is not specially restricted. They may be made circular or semicircular. When bores having a diameter of around or not more than 100 $\mu$m are formed to furnish the feeding conductor layers with heat radiating functions, the distance between adjacent bores is preferably set to 1–2 mm. It is very preferable that a power source substrate is formed by alternately laminating the filler-containing electrically insulating layers 6 shown in FIG. 2 and the bore-carrying feeding conductor layers 7 shown in FIG. 3.

Figure 4:
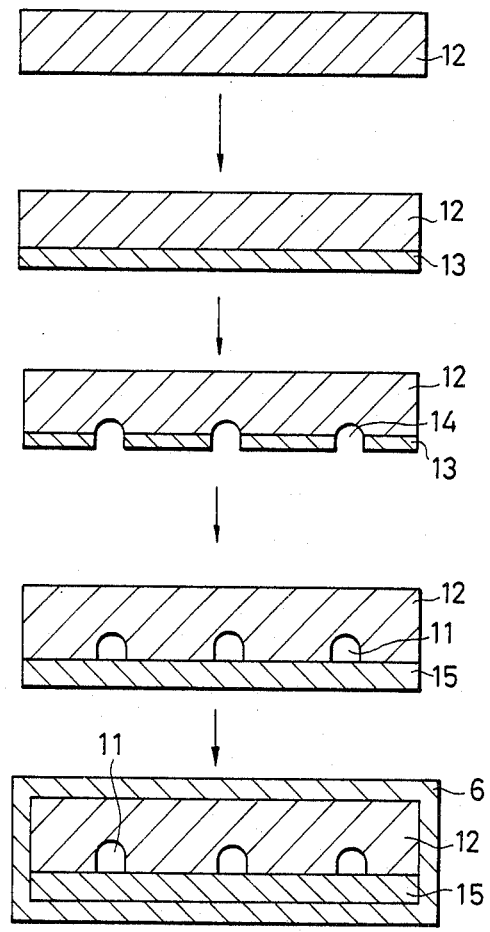
FIG. 4 illustrates the steps of manufacturing an example of the feeding conductor layer in the present invention.

FIG. 4 illustrates an example of a method of forming the semicircular bores 11 shown in FIG. 3, by the photoetching techniques. A bonding alloy film 13 is formed by deposition on one surface of a conductor plate 12 consisting of a copper plate. When the conductor plate 12 consists of copper or a copper alloy, it is preferable to use a copper-silver alloy or a copper-titanium alloy as the material for the bonding alloy film 13. The thickness of the bonding alloy film 13 may be around 2-3 μm.

After the bonding alloy film 13 has been formed, grooves 14 are then formed by photoetching. After the grooves 14 have been formed, a conductor plate 15 identical with the conductor plate 12 or some other type of conductor plate 15 having excellent conductivity is laminated on the bonding alloy film 13. The material for this conductor plate 15 is selected from the materials which can be bonded to the conductor plate 12 via the bonding alloy film 13. To be concrete, a material identical with that of which the conductor plate 12 is made may be used. These parts are then heated in a vacuum furnace to bond the conductor plate 12 to the conductor plate 15 via the bonding alloy film 13 and thereby combine them unitary. Consequently, the elongated openings of the grooves 14 are closed to form semicircular bores 11. The bonding alloy film 13 is diffused into the interior of the conductors 12, 15 while it is heated under vacuum, and it substantially disappears in a final stage of the heating operation from the interface between the same conductors.

The outer surfaces of the conductor plates 12, 15 are then coated with an organic resin, such as epoxy resin, whereby an electrically insulating layer 6 can be formed.

The methods of coating the outer surfaces of the conductor plates 12, 15 include a method practiced by dissolving, for example, epoxy resin in acetone, applying the resultant solution to the conductor plates, and thereafter heating the resultant product at 80°-100° C. for 10-20 minutes so as to remove the acetone, the solvent. The feeding conductor layer and electrically insulating layer are thus combined unitarily. A plurality of such unitary combined products are then laminated and heated under pressure for several hours. Thus, a power source substrate having a desired laminated structure can be manufactured.

Figure 5:
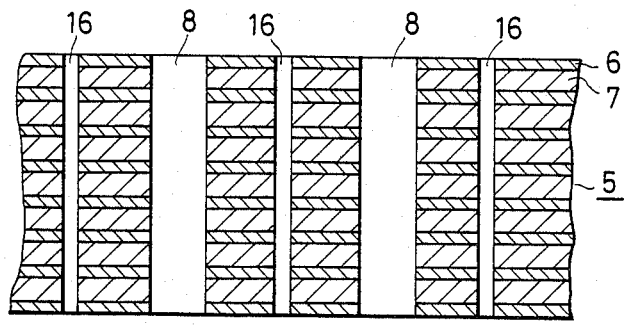
FIG. 5 is a sectioned front elevation of another example of the power source substrate in the present invention.
Figure 6:
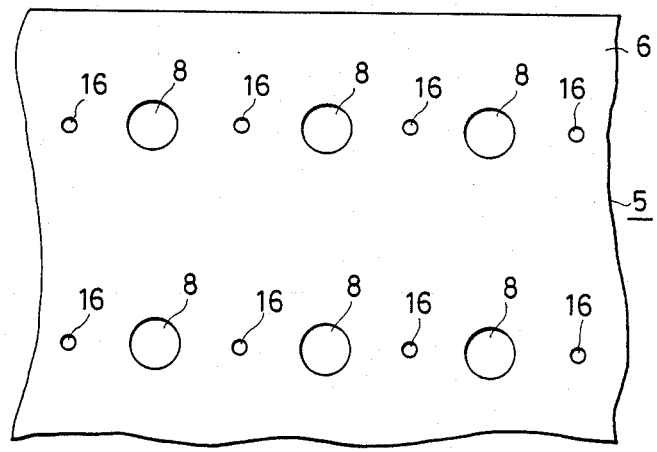
FIG. 6 is a plan view of the example of FIG. 5.

FIG. 5 is a sectioned front elevation of a power source substrate having through bores 16 extending in the direction of the thickness thereof, i.e., in the direction which is at right angles to the direction of extension of each of the laminated electrically insulating layers 6 and feeding conductor layers 7 in this power source substrate 5. FIG. 6 is a plan view of a power source substrate having through bores 16. In this case, it is necessary that heat radiating means be also provided in at least the electrically insulating layers 6 or the feeding conductor layers 7. The generation of heat in the power source substrate can further be suppressed by sending a gas, such as the air by a blower, or a liquid, such as water from the lower side thereof, i.e. the side thereof which is not adjacent to a wiring substrate into the through bores 16. The power source substrate thus formed is capable of suppressing a temperature increase by 20-30% as compared with a power source substrate which is not provided with the through bores 16.

The number of the feeding conductor layers 17 can be regulated arbitrarily in accordance with the scale of integration of the chips. The thickness of the feeding conductor layer or electrically insulating layer can also be regulated arbitrarily. A means for supplying a coolant to the bores 11 shown in FIG. 3 or the through bores 16 shown in FIGS. 5 and 6 may also be selected arbitrarily, and is not specially limited.

The filter used as the heat radiating means for the electrically insulating layers consists preferably of a powdered material or fibers. When a powdered material is used, the particle size shall be set not larger than the thickness of the electrically insulating layer. The filler-mixed electrically insulating layer was manufactured in the following manner.

4 parts by weight of $BF_3$ monoethyl amine was mixed with 100 parts by weight of epoxy resin, and alumina powder having a particle size of about 30 μm was then mixed with this mixture so that the weight of the alumina powder occupied 30% of a total weight of the resultant mixture. The acetone was added to this mixture to dissolve the organic resin therein, and the resultant mixture was applied to a feeding conductor plate of copper. The resultant product was heated at about 80° C. for 10-20 minutes to dry the same, whereby the acetone, the solvent was removed therefrom. The thickness of the feeding conductor plate is about 300 μm, and the thickness of the electrically insulating plate about 200 μm. Seven plates thus formed were laminated, and heated under a pressure of about 5 kgf/cm$^2$, at a temperature of 120° C. for 4 hours and continuously heated at a temperature of 160° C. for 10 hours under the same pressure to harden the resin. The electrically insulating layers and feeding conductor layers were bonded to one another in very good condition. Cracks did not occur in the electrically insulating layer.

Figure 7:
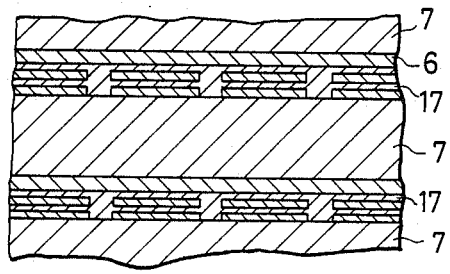
FIGS. 7–10 are sectioned front elevations of other examples of the power source substrate in the present invention.

FIG. 7 is a sectioned front elevation of a part of an example of a power source substrate, in which metal wires 17 of a high heat conductivity, for example, copper wires are inserted in the electrically insulating layers 6 of an organic resin to reduce the thermal resistance. These heat conductive metal wires 17 spot-contact the adjacent feeding conductor layers 7 at several positions, so that the heat accumulated in the electrically insulating layers 6 can be removed efficiently through the feeding conductor layers 7. The metal wires 17 in each of the electrically insulating layers 6 should be disposed in contact with only one of the adjacent feeding conductor layers 7. If the metal wires 17 in the same electrically insulating layer are disposed in contact with both of the adjacent feeding conductor layers, short-circuiting occurs. Therefore, disposing the wires 17 in this manner should be avoided.

Figure 8:
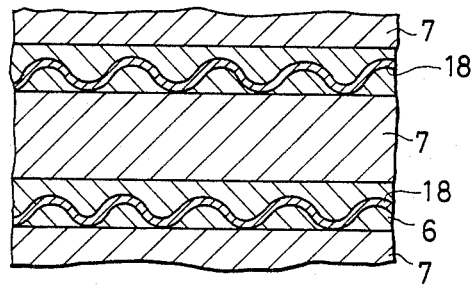

FIG. 8 shows an example of a power source substrate, in which elongated metallic fibers 18 having a high heat conductivity and molded to a wavy shape are buried in the electrically insulating layers 6. This structure can also obtain the same heat radiating effect as the example of FIG. 7. It is also possible that molding a plurality of elongated metallic fibers to a wavy shape be done after they have been bundled up.

Figure 11:
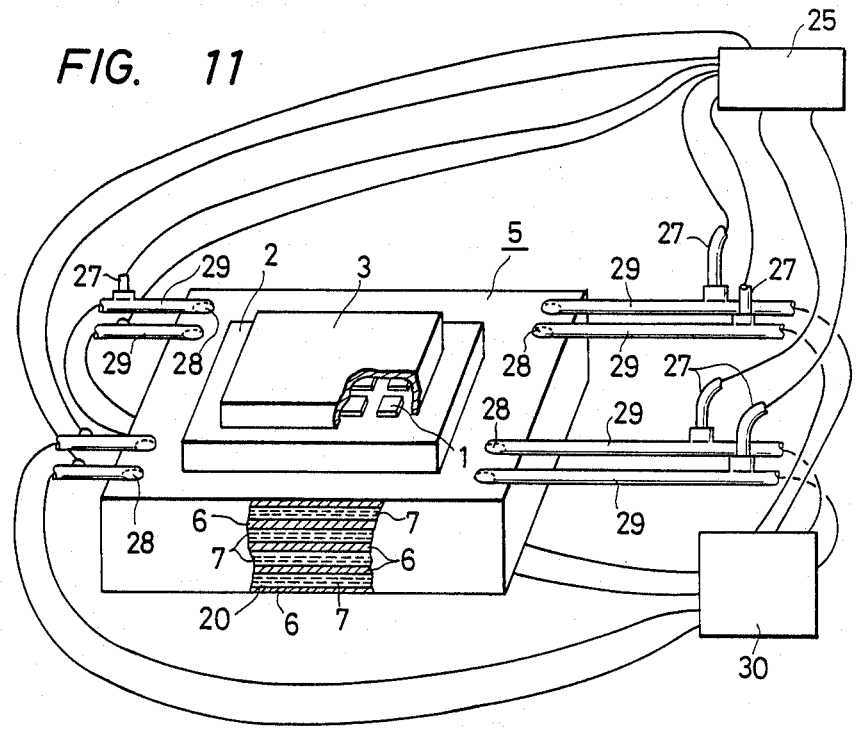
FIG. 11 illustrates an embodiment of the integrated circuit device according to the present invention including connecting terminals therefor.

FIG. 11 is a schematic diagram of the integrated circuit device according to the present invention connected to an external power source means. A plurality of integrated circuit chips, such as LSI chips are mounted on a wiring substrate 2 and covered with a seal cap 3. The wiring substrate 2 and a power source substrate 5 are connected electrically by terminal pins (not shown). The power source substrate 5 is formed by laminating electrically insulating layers 6 and feeding conductor layers 7 alternately and combining them unitary. The example of FIG. 11 is provided with five electrically insulating layers 6 and four feeding conductor layers 7.

Coolant flow passages 20 are formed in the feeding conductor layers 7 in the power source substrate 5. The supplying of an electric current from an external power source means 30 to the feeding conductor layers 7 and the supplying and discharging of a coolant to and from the same layers 7 are done via feeding connecting terminals 28 and conductors 29. Reference numeral 25 denotes a coolant tank, the coolant in which is supplied to coolant inlet ports 27 provided at predetermined portions of the conductors 29. The feeding connecting terminals 28 will now be described with reference to FIGS. 12, 13 and 14.

Figure 12:
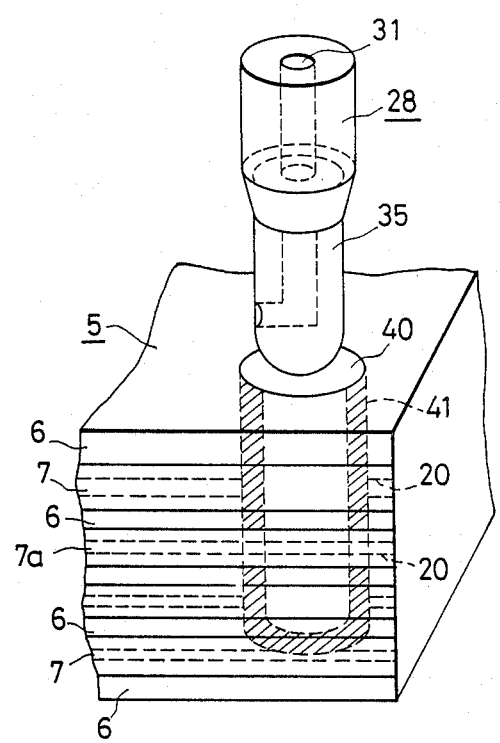
FIG. 12 illustrates a pin-connector connecting system in the present invention.

FIG. 12 is a perspective view illustrating the construction of the joint portions of a terminal pin 35 of a feeding connecting terminal 28 and a connector 40 in a power source substrate 5. The pin 35 is provided with a coolant passage 31 so that a coolant flows from the coolant tank thereinto. The pin 35 and the external power source means 30 and coolant tank 25 are connected together by conductors 29 extending from the pins 35. The coolant flowing in the coolant passage 31 is supplied thereinto from the coolant tank 25 and via a coolant inlet port 27 provided at a predetermined portion of a conductor 29.

The connector 40 is formed in the power source substrate 5. An insulated layer 41 is formed on the inner surface of the connector 40 except the portion of the same inner surface which corresponds to a conductor layer 7a into which an electric current and coolant are introduced via the feeding connecting terminal 28. The introduction of the coolant from the feeding connecting terminal to the conductor layer 7a is done by sending the coolant into the coolant passage 20 in the conductor layer 7a through the coolant passage 31.

Figure 13:
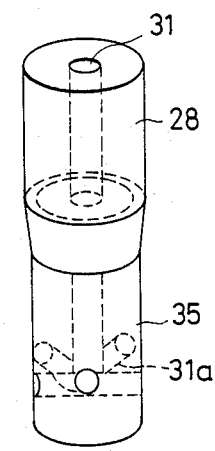
FIGS. 13 and 14 illustrate modified examples of the pin in the present invention.

In order to easily align the coolant passage 31 in the feeding connecting terminal 29 with the coolant passages 20 in the conductor layers 7, it is preferable that a plurality of coolant outlet ports 31a be provided in the connecting terminal 28 as shown in FIG. 13.

There is a leakage problem concerning the introduction of coolant from the coolant passage 31 in the feeding connecting terminal 28 into the coolant flow passages 20 in the conductor layers 7. This problem can be solved by forming a leakage-preventing layer (not shown) consisting of rubber on each coolant outlet port 31a so that a clearance does not occur between the coolant outlet ports 31a and coolant flow passages 20.

Figure 14:
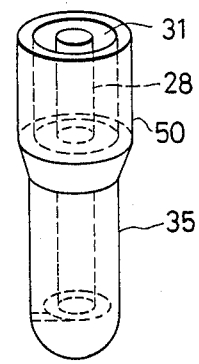

FIG. 14 shows another example of the feeding connecting terminal 28. This connecting terminal 28 is inserted in a hose 50 of Teflon so that a coolant flows in a space between the outer surface of the connecting terminal 28 and the inner surface of the hose 50.

The structure for connecting the power source substrate to the external power source means is not limited to the structure described above.

In order to further suppress an increase in the temperature in the integrated circuit device, it is preferable that the coolant be also supplied into the cables by which the external power source means 30 and conductors 29 are connected.

The connectors 40 in the feeding conductor layers 7 in the power source substrate and through holes 8 can be formed by a boring operation utilizing thermal energy including a laser beam or an electron beam, or a boring operation using mechanical tools.

During the formation of the through holes 8 in the power source substrate 5, an electrically insulating layer may be provided on the inner surface of each thereof in the same manner as in the production of the connectors 40. However, it is necessary that such an electrically insulating layer is not formed on the inner surface of each through hole in the feeding conductor layers which are connected electrically to the terminal pins 4 on the wiring substrate 2.

According to the present invention described above, the heat radiating capability of the power source substrate can be improved markedly, and the integrated circuit chips can be mounted with a high density on a wiring substrate in an integrated circuit device. Especially, since the electrically insulating layers are formed of an organic resin and a heat conductive filler, a compact integrated circuit device can be obtained.

Since a coolant is supplied into the coolant flow passages in the power source substrate by utilizing the electric current feeding passges extending from the external power source means to the power source substrate, the integrated circuit device can be made compact as compared with an integrated circuit device in which the supplying of an electric current and coolant is done separately. If the integrated circuit device is formed in this manner, the conductors between the external power source means and feeding connecting terminals are also cooled, so that an increase in the temperature in the integrated circuit device can further be reduced.

What is claimed is:

1. An integrated circuit device comprising a wiring substrate on one surface of which integrated circuit chips are mounted; a power source substrate of a laminated structure provided in contact with the other surface of said wiring substrate, and formed by alternately laminating layers of a heat and electrically conductive metal, for supplying electrical current to the integrated circuit chips, and electrically insulating layers of an electrically insulating material, and bonding together said laminated layers, the laminated structure including a plurality of the layers of a heat and electrically conductive metal and a plurality of the electrically insulating layers; a means for electrically connecting said wiring substrate and said power source substrate to each other; and a heat radiating means inserted in at least one of said layers of a heat and electrically conductive metal and said electrically insulating layers, of said power source substrate, and adapted to radiate the heat, which occurs in said power source substrate, to the outside thereof, said heat radiating means being inserted in at least one of the layers of a heat and electrically conductive metal and the electrically insulating layers of the power source substrate closest to the wiring substrate.

2. An integrated circuit device according to claim 1, wherein the material for said layers of a heat and electrically conductive metal is one of copper, a copper-silver alloy and a copper-titanium alloy.

3. An integrated circuit device according to claim 1, wherein the material for said electrically insulating layers is an organic resin.

4. An integrated circuit device according to claim 3, wherein said organic resin consists of one resin selected from the group composed of epoxy resin, addition-polymerized polyimide, polyvinylidene fluoride and phenol formaldehyde.

5. An integrated circuit device according to claim 1, wherein said material for the electrically insulating layers is an inorganic material, and wherein the inorganic material consists of one material selected from the group composed of a SiC ceramic material, alumina and beryllium.

6. An integrated circuit device comprising a wiring substrate having integrated circuit chips on one surface thereof and terminal pins on the other surface thereof; a power source substrate disposed in contact with the terminal pin-carrying surface of said wiring substrate, having a laminated structure formed by alternately bonding layers of a heat and electrically conductive metal, for supplying electrical current to the integrated circuit chips, and electrically insulating layers of an electrically insulating material to one another, and provided with through holes in which said terminal pins are inserted, the laminated structure including a plurality of the layers of a heat and electrically conductive metal and a plurality of the electrically insulating layers; a heat radiating means provided in the interior of at least one of said layers of heat and electrically conductive metal and said electrically insulating layers, of the power source substrate, and adapted to radiate the heat, which occurs in said power source substrate, to the outside thereof; and a blowing and cooling means disposed sufficiently close to said power source substrate so as to send air to said power source substrate and thereby cool the same.

7. An integrated circuit device according to claim 1, wherein said heat radiating means is inserted in the electrically insulating layers of the power source substrate closest to the wiring substrate.

8. An integrated circuit device comprising a wiring substrate on one surface of which integrated circuit chips are mounted; a power source substrate of a laminated structure provided in contact with the other surface of said wiring substrate, and formed by alternately laminating layers of a heat and electrically conductive metal, for supplying electrical current to the integrated circuit chips, and electrically insulating layers of an electrically insulating material, the material of the electrically insulating layers having a coefficient of electrostatic induction of not less than 4, and bonding together said laminated layers, the laminated structure including a plurality of the layers of a heat and electrically conductive metal and a plurality of the electrically insulating layers; a means for electrically connecting said wiring substrate and said power source substrate to each other; and a heat radiating means inserted in at least one of said layers of a heat and electrically conductive metal and said electrically insulating layers, of said power source substrate, and adapted to radiate the heat, which occurs in said power source substrate, to the outside thereof.

9. An integrated circuit device comprising a wiring substrate having integrated circuit chips mounted on one surface thereof; a power source substrate disposed in contact with the other surface of said wiring substrate, and having a laminated structure formed by alternately bonding layers of a heat and electrically conductive metal, for supplying electrical current to the integrated circuit chips, and layers of an electrically insulating material to one another, the laminated structure including a plurality of the layers of a heat and electrically conductive metal and a plurality of the electrically insulating layers; and a means for electrically connecting said wiring substrate and said power source substrate to each other, at least one of said layers of a heat and electrically conductive metal and said electrically insulating layers, of said power source substrate, having through bores extending in parallel with said layers and used to introduce a gaseous coolant from the outside of said layers thereinto, the bores having a radius of 80–120 $\mu$m.

10. An integrated circuit device comprising a wiring substrate having integrated circuit chips mounted on one surface thereof; a power source substrate disposed in contact with the other surface of said wiring substrate, and having a laminated structure formed by alternately bonding layers of a heat and electrically conductive metal, for supplying electrical current to the integrated circuit chips, and electrically insulating layers of an electrically insulating material, to one another, the laminated structure including a plurality of the layers of a heat and electrically conductive metal and a plurality of the electrically insulating layers; and a means for electrically connecting said wiring substrate and said power source substrate to each other, at least one of said layers of heat and electrically conductive metal and said electrically insulating layers, of said power source substrate, having holes into which a coolant is to be introduced from the outside of said layers, said holes being bores that extend through the laminated structure of the power source substrate, in a direction perpendicular to said layers.

11. An integrated circuit device comprising a wiring substrate on one surface of which integrated circuit chips are mounted; a power source substrate of a laminated structure provided in contact with the other surface of said wiring substrate, and formed by alternately laminating layers of a heat and electrically conductive metal, for supplying electrical current to the integrated circuit chips, and electrically insulating layers of an electrically insulating material, and bonding together said laminated layers, the laminated structure including a plurality of the layers of a heat and electrically conductive metal and a plurality of the electrically insulating layers; a means for electrically connecting said wiring substrate and said power source substrate to each other; and a heat radiating means inserted in at least one of said layers of a heat and electrically conductive metal and said electrically insulating layers, of said power source substrate, and adapted to radiate the heat, which occurs in said power source substrate, to the outside thereof, said heat radiating means being heat conductive metal wires in the electrically insulating layers and spot-contacted to one of the two adjacent layers of a heat and electrically conductive metal.

12. An integrated circuit device according to claim 6, wherein at least one of said layers of heat and electrically conductive metal and said electrically insulating layers, of said power source substrate, has holes into which a coolant is to be introduced from the outside of said layers.

13. An integrated circuit device according to claim 6, wherein at least one of said layers of a heat and electrically conductive metal and said electrically insulating layers, of said power source substrate, has through bores extending in parallel with said layers, the through bores being used to introduce a gaseous coolant from the outside of said layers thereinto.

14. An integrated circuit device according to claim 6, wherein at least one of said layers of a heat and electrically conductive material and said electrically insulating layers, of said power source substrate, has through bores extending in parallel with said layers, the through bores being used to introduce a liquid coolant from the outside of said layers thereinto.

15. An integrated circuit device according to claim 6, wherein said heat radiating means includes a heat radiating filler in the form of powder or fibers contained in at least one of said layers of heat and electrically conductive metal and said electrically insulating layers, of the power source substrate.

* * * * *